United States Patent
Chaudhry et al.

(10) Patent No.: US 6,667,536 B2
(45) Date of Patent: Dec. 23, 2003

(54) THIN FILM MULTI-LAYER HIGH Q TRANSFORMER FORMED IN A SEMICONDUCTOR SUBSTRATE

(75) Inventors: Samir Chaudhry, Orlando, FL (US); Paul Arthur Layman, Orlando, FL (US); J. Ross Thomson, Clermont, FL (US); Mohamed Laradji, St. Cloud, FL (US); Michelle D. Griglione, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/972,481

(22) Filed: Oct. 5, 2001

(65) Prior Publication Data

US 2003/0003603 A1 Jan. 2, 2003

Related U.S. Application Data

(60) Provisional application No. 60/301,285, filed on Jun. 28, 2001.

(51) Int. Cl.[7] .......................... H01L 29/00; H01F 7/06; H01E 27/28
(52) U.S. Cl. ....................... 257/531; 257/528; 29/602.1; 336/220
(58) Field of Search ................................ 257/531, 528, 257/692, 700, 758; 29/602.1; 336/200, 220

(56) References Cited

U.S. PATENT DOCUMENTS

| | | |
|---|---|---|
| 4,313,152 A | 1/1982 | Vranken |
| 5,095,357 A | 3/1992 | Andoh et al. |
| 5,157,576 A | 10/1992 | Takaya et al. |
| 5,227,659 A | 7/1993 | Hubbard |
| 5,446,311 A | 8/1995 | Ewen et al. |

(List continued on next page.)

FOREIGN PATENT DOCUMENTS

| | | |
|---|---|---|
| EP | 0 643 402 A2 | 8/1990 |
| EP | 0 778 593 A1 | 6/1997 |
| WO | WO 02/13271 A2 | 2/2002 |

OTHER PUBLICATIONS

Niknejad, Ali M. and Meyer, Robert G.; "Design, Simulation and Applications of Inductors and Transformers for Si RF ICs"; Kluwer Academic Publishers, Boston/Dordrecht/London; pp. 22–31.

*Primary Examiner*—Ha Tran Nguyen
(74) *Attorney, Agent, or Firm*—John L. DeAngelis, Jr.; Beusse Brownlee Bowdoin & Wolter, P.A.

(57) ABSTRACT

A thin-film multi-layer high Q transformer. To form an outer transformer winding a plurality of parallel first level metal runners are formed in a first insulating layer overlying the semiconductor substrate. A plurality of vertical conductive vias are formed in third and fourth insulating layers and in electrical communication with each end of the first level metal runners. A fourth insulating layer is disposed over the third insulating layer and additional vertical conductive vias and a fourth level metal runner are formed therein. Thus, the fourth level metal runners and the intervening vertical conductive vias connect each of the first level metal runners to form a continuously conductive structure having a generally helical shape. The inner winding of the transformer is similarly formed. A plurality of parallel second level metal runners are formed within the second insulating layer and a plurality of conductive vias and third level metal runners are formed within the third insulating layer to interconnect the plurality of second level metal runners to form a continuously conductive structure having a generally helical shape and disposed at least partially within the outer transformer winding.

2 Claims, 9 Drawing Sheets

U.S. PATENT DOCUMENTS

| | | |
|---|---|---|
| 5,479,695 A * | 1/1996 | Grader et al. |
| 5,541,442 A | 7/1996 | Keil et al. |
| 5,559,360 A | 9/1996 | Chiu et al. |
| 5,576,680 A | 11/1996 | Ling |
| 5,610,433 A * | 3/1997 | Merrill et al. |
| 5,717,243 A | 2/1998 | Lowther |
| 5,736,749 A | 4/1998 | Xie |
| 5,863,806 A | 1/1999 | Lue |
| 6,008,102 A | 12/1999 | Alford et al. |
| 6,015,742 A | 1/2000 | Ju |
| 6,031,445 A * | 2/2000 | Marty et al. |
| 6,037,649 A | 3/2000 | Liou |
| 6,057,202 A | 5/2000 | Chen et al. |
| 6,083,802 A | 7/2000 | Wen et al. |
| 6,124,624 A | 9/2000 | Van Roosmalen et al. |
| 6,140,197 A | 10/2000 | Chu et al. |
| 6,160,303 A | 12/2000 | Fattaruso |
| 6,187,647 B1 | 2/2001 | Chu |
| 6,240,622 B1 | 6/2001 | Ahn et al. |
| 6,249,191 B1 | 6/2001 | Forbes |
| 6,255,714 B1 | 7/2001 | Kossives et al. |

* cited by examiner

THIN FILM MULTI-LAYER HIGH Q TRANSFORMER FORMED IN A SEMICONDUCTOR SUBSTRATE

This patent application claims priority to the provisional patent application filed on Jun. 28, 2001, and assigned Ser. No. 60/301,285.

FIELD OF THE INVENTION

This invention relates generally to transformers formed on an integrated circuit substrate, and more specifically to transformers having an outer core spanning at least three metal layers of the integrated circuit substrate.

BACKGROUND OF THE INVENTION

The current revolution in wireless communications and the need for smaller wireless communications devices has spawned significant efforts directed to the optimization and miniaturization of radio communications electronics devices. Passive components of these devices (such as inductors, capacitors and transformers), play a necessary role in the devices' operation and thus efforts are directed toward reducing the size and improving the fabrication efficiency of such components.

Transformers, which play an integral role in the performance of electronic communications devices, are electromagnetic components comprising a primary and a secondary winding. Conventionally, the windings are wound on a common core, which forms a closed loop magnetic circuit. Iron cores are typical to enhance the transformer effect, but not required. Each winding comprises a plurality of turns. The relationship between the primary and secondary voltage is a function of the primary to secondary turns ratio, and the relationship between the primary and secondary current is an inverse function of the turns ratio. As is known, there are many different physical configurations for the transformer windings and core. In one embodiment, for example, the primary and secondary windings form a helical structure, with the secondary windings oriented within the opening formed by the primary windings. Transformers also serve in varied applications, including power applications for stepping applied voltages up or down and for impedance matching at frequencies from audio to radio frequency (RF). With the continual allocation of operational communications frequencies into higher frequency bands, transformers used in impedance-matching applications suffer impaired performance due to increased eddy current and skin effect losses.

The Q (or quality factor) is an important transformer figure of merit. The Q measures the ratio of inductive reactance to inductive resistance within the transformer windings. High Q transformers present a narrow peak when the transformer current is graphed as a function of the input signal frequency, with the peak representing the frequency at which the transformer resonates. High Q transformers are especially important for use in frequency-dependent circuits operating with narrow bandwidths. Because the Q value is an inverse function of transformer resistance, it is especially important to minimize the resistance to increase the Q.

Most personal communications devices incorporate integrated circuit active components fabricated using semiconductor technologies, such as silicon or gallium-arsenide. The prior art teaches certain integrated inductive structures (including toroidal or spiral shaped inductors) developed to achieve compatibility with the silicon-based integrated circuit fabrication processes. When two such inductors are proximately formed, the coupling of the magnetic field formed by current flow through one winding (the primary) into the winding area of the other winding (the secondary) results in transformer action and the flow of current in the secondary. However, such planar inductors tend to suffer from high losses and low Q factors at the operative frequencies of interest. These losses and low Q factors are generally attributable to dielectric losses caused by parasitic capacitances and resistive losses due to the use of thin and relatively high resistivity conductors in the transformer structure. Another disadvantage of conventional planar inductors and transformers formed from them is a result of the magnetic field lines (which are perpendicular to the semiconductor substrate surface) entering the semiconductor and dielectric layers above, beside and below the transformer. This increases the inductive losses and lowers the transformer's Q factor. Also, unless the transformer is located a significant distance from active circuit elements formed in the silicon, the magnetic field lines induce currents in and therefore disrupt operation of the active components.

With integrated circuit active devices growing smaller and operating at higher speeds, the interconnect system should not add processing delays to the device signals. Use of conventional aluminum interconnect metallization restricts circuit operational speed as the longer interconnects and smaller interconnect cross-sections increase the interconnect resistance. Also, the relatively small contact resistance between the aluminum and silicon surfaces creates a significant total resistance as the number of circuit components grows. It is also difficult to deposit aluminum with a high aspect ratio in vias and plugs, where the aspect ratio is defined as the ratio of plug thickness to diameter.

Given theses disadvantages, copper is becoming the interconnect of choice because it is a better conductor than aluminum (with a resistance of 1.7 micro-ohm cm compared to 3.1 micro-ohm cm for aluminum), is less susceptible to electromigration, can be deposited at lower temperatures (thereby avoiding deleterious effects on the device dopant profiles) and is suitable for use as a plug material in a high aspect ration plug. Copper interconnects can be formed by chemical vapor deposition, sputtering, electroplating and electrolytic plating.

The damascene process is one technique for forming active device copper interconnects. A trench is formed in a surface dielectric layer and the copper material is then deposited therein. Usually the trench is overfilled, requiring a chemical and mechanical polishing step to re-planarize the surface. This process offers superior dimensional control because it eliminates the dimensional variations introduced in a typical pattern and etch interconnect process. The dual damascene process extends the damascene process, simultaneously forming both the underlying conductive vias and the interconnecting trenches from copper. First the via opening is formed, followed by formation of a trench between two via openings to be interconnected. A subsequent metal deposition step fills both the via openings and the trench, forming an integral metal layer and conductive via to the metal layer below. A chemical and mechanical polishing step planarizes the top surface or the substrate. Dual damascene processes are discussed in detail in the following references, which are hereby incorporated by reference: C. K. Hu et. al., Proceedings MRS Symposium on VLSI, vol. 5, p. 369 (1990); B. Luther et. al. Proceedings VMIC, vol. 10, p. 15 (1994); D. Edelstein, Proceedings ECS Mtg., vol. 96–2, p. 335 (1996).

BRIEF SUMMARY OF THE INVENTION

To provide further advances in the fabrication of transformers in conjunction with active devices on a semiconductor substrate, an architecture and processes is provided for forming such a transformer within the conventional metal layers of an integrated circuit, wherein the transformer core area is larger than prior art transformers, resulting in a higher inductance value and a higher Q figure of merit. Also, a transformer formed according to the teachings of the present inventions has a desirable low-resistance (and thus high Q) in a relatively compact area of the integrated circuit.

According to one embodiment of the invention, a plurality of parallel lower conductive strips are formed overlying the semiconductor substrate, in which active components were previously formed. First and second vertical conductive via openings are formed over first and second opposing edges of each lower conductive strip and conductive material is deposited within the via openings to form first and second conductive vias. Two additional via openings are formed in vertical alignment with the first and the second conductive vias and filled with metal to form third and fourth conductive vias. A plurality of upper conductive strips are then formed, wherein the plane of an upper conductive strip intersects the plane of a lower conductive strip such that a first edge of one upper conductive strip overlies the first edge of a lower conductive strip, and the two edges are interconnected by the first and the third conductive vias. A second edge of the upper conductive strip overlies the second edge of the next parallel lower conductive strip, and these edges are electrically connected by the second and the fourth conductive vias. Thus is formed an outer helical winding of the transformer. An inner winding of the transformer is similarly formed. The bottom segment of the inner winding is formed at least one metal layer above the bottom segment of the outer winding, and the top segment of the inner winding is at least one metal layer below the top segment of the inner winding. Although the transformer must be formed in at least four metal layers (i.e., the bottom segment of the inner and windings and the top segment of the inner and outer windings), there can be more than one metal layer between the various winding segments and the bottom segment of the outer winding can be formed on any of the integrated circuit metal layers, with the additional winding segments formed above it.

The use of certain layout and metallization techniques for constructing a transformer according to the techniques of the present invention result in lower resistive losses in the conductive material, thereby reducing eddy current losses and also increasing the transformer Q factor. According to one embodiment of the present invention, a multi-layer dual-damascene metallization techniques is employed to form the transformer. A plurality of parallel metal-1 runners are formed in a first stack of insulating materials. A second stack of insulating materials is disposed over the first stack and a plurality of first and second via openings are formed therein, wherein each one of the plurality of first via openings is in contact with a first end of a metal-1 runner, and each one of the plurality of second via openings is in contact with a second end of the metal-1 runner. A metal-2 trench is formed within one or more upper layers of the second stack, and the first and the second via openings and trench are then filled with copper. The metal-2 runner is set back from the vertical plane of the metal-1 runner. A third stack of insulating layers is disposed over the second stack and four via openings are formed therein. Third and fourth via openings are each in electrical contact with one of the first and second conductive vias, respectively. Fifth via openings are in contact with a first end of the metal-2 trench and sixth via openings are in contact with a second end of the metal-2 trench. A metal-3 trench is formed interconnecting the upper end of the fifth and sixth via openings, but the metal-3 trench connects two successive metal-2 runners. Thus one end of the metal-3 trench is connected to a sixth via opening of a metal-2 runner and the other end of the metal-3 trench connects with the fifth via opening of the next metal-2 runner in the plurality of parallel metal-2 runners. The third, fourth, fifth and sixth via openings and the metal-3 trenches are then filled with copper. A fourth stack of insulating layers is disposed over the structure and seventh and eighth via openings are formed therein and vertically aligned with the third and fourth conductive vias, respectively. A metal-4 trench is formed in the upper portion of the top insulating stack, with one end of the metal-4 runner in contact with an eighth via opening, and the other end of the metal-4 trench in contact with a seventh via opening of the next metal-1 runner in the plurality of parallel metal-1 runners. In this way, the metal-4 trench interconnects two successive metal-1 runners. The metal-4 trench and the seventh and eighth via openings are filled with copper. In a cross sectional view, the resulting structure forms two concentric rectangles of conductive material. In the top view, the metal-1 and metal-4 runners form a helix with each metal-4 runner interconnecting successive metal-1 runners. Similarly, the metal-2 and metal-3 runners form a helix with each metal-3 runner electrically interconnecting successive metal-2 runners. The resulting structure comprises a transformer, with an outer winding formed by the metal-1 and metal-4 runners and an inner winding formed by the metal-2 and metal-3 runners.

BRIEF DESCRIPTION OF THE DRAWINGS

The present invention can be more easily understood and the further advantages and uses thereof more readily apparent, when considered in view of the detailed description of the invention and the following figures in which.

In accordance with common practice, the various described device features are not drawn to scale, but are drawn to emphasize specific features relevant to the invention. Reference characters denote like elements throughout the figures and text.

DETAILED DESCRIPTION OF THE INVENTION

The description of the method for forming a transformer described below is generally directed to the formation of the elements associated with a single winding of the outer and the inner transformer coils. It will be apparent to those skilled in the art that a plurality of such windings are being simultaneously formed in the integrated circuit substrate. However, in the description below it is also frequently necessary to refer to interconnections between successive windings.

Figure 1:
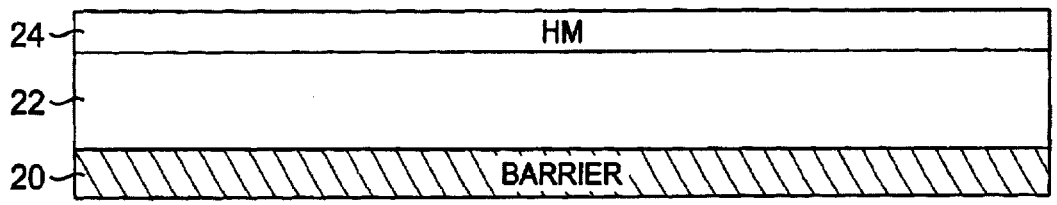
FIGS. 1 through 11 illustrate, in cross-section, a transformer structure according to embodiments of the present invention during sequential fabrication steps.

The preferred process according to the present invention begins as shown in FIG. 1 where a plurality of insulating layers are formed over an existing integrated circuit substrate, which conventionally includes a plurality of active elements. Typically, at this point in the conventional fabrication process, no metal interconnect layers have been formed interconnecting active device regions; only the vias or windows for gaining access to the active device regions have been formed. A barrier layer 20 overlies the surface of the semiconductor substrate and is preferably formed of tantalum, tantalum-nitride, titanium or titanium-nitride. Next an insulating layer 22 of a relatively low dielectric constant material is formed over the barrier layer 20. Low dielectric silicon dioxide, black diamond and coral are suitable candidates for the insulating layer 22. The relative dielectric constant for silicon dioxide is about 3.9. Thus a low relative dielectric constant is generally considered to be less than about 3.0. A low dielectric constant material reduces inter-layer capacitance and therefore potential crosstalk between signals carried on the metal interconnects adjacent the dielectric layers. The barrier layer 20 and the insulating layer 22 can be formed by chemical vapor deposition.

Figure 2:
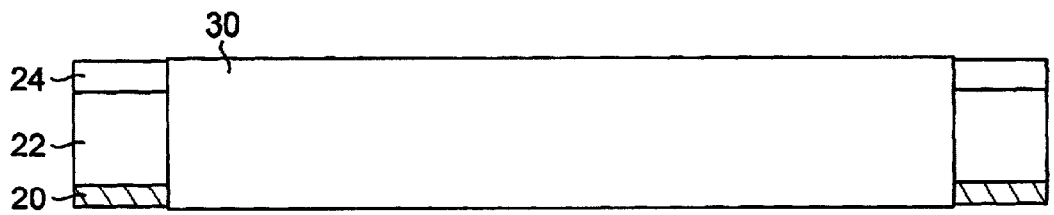

In a preferred embodiment, a layer 24 overlying the insulating layer 22 comprises a hard mask of silicon dioxide. To etch a layer or layers below a hard mask, photoresist material is applied over the hard mask, the photoresist is patterned and then the pattern is transferred from the photo resist to the hard mask. The photoresist is removed and the etching steps are carried out using the hard mask pattern. This process advantageously offers better dimensional control of the etched features. In lieu of a hard mask, conventional photoresist patterning and etching steps can be utilized. In either case, as shown in FIG. 2, a window or trench 30 is formed in the barrier layer 20, the insulating layer 22 and the hard mask layer 24, by the use of suitable etchants. In the top view, the trench 30 is circular or elliptical. Generally, patterning and etching steps do not allow formation of sharp-cornered structural shapes, and thus windows and trenches, when viewed from the top, are typically circular, elliptical, or have relatively straight edges and rounded corners between the edges.

Figure 3:
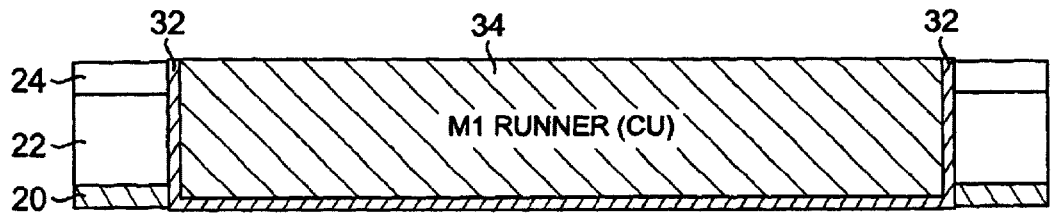

Turning to FIG. 3, a barrier and seed layer 32 is deposited. Typically, this is accomplished in two steps. First a barrier material is sputtered into the trench 30. Tantalum, tantalum-nitride, titanium and titanium-nitride are candidate materials for the barrier layer. Next, a thin copper seed layer is deposited, preferably by sputtering. The seed layer is required as a starting layer for the electroplated copper. Both the barrier material and the seed material of the barrier and seed layer 32 can also be deposited by conventional chemical vapor deposition and electroplating processes. A metal-1 runner layer 34 is now formed, preferably by electroplating copper. Electroplating is especially advantageous because it can be performed at a low temperature at a relatively low cost. The low temperature deposition feature is advantageous as it avoids changes in the dopant profiles. The substrate is then chemically-mechanically polished to remove the electroplated copper from all regions except within the metal-1 runner 34. This process for depositing copper layers in the insulating layers is known as the damascene process. It offers superior dimensional control because it eliminates the variations introduced in a conventional metal pattern and etch process where the vias and the interconnects are formed in two separate steps.

In certain circuit configurations it may be necessary to connect the metal-1 runner 34 to underlying regions in the substrate,. For instance, one end of the metal-1 runner can serve as a transformer terminal for connection to another component in the circuit. This can be accomplished by a dual damascene process by first forming a via opening connecting one end of the metal-1 runner to an underlying device region. The second step forms the trench 30, and the third step simultaneously fills the via opening and the trench 30 to form a conductive via and the metal-1 runner 34. Thus by this technique the metal-1 runner is connected to the underlying device region.

Although the present invention is described and shown in the Figures with the bottom segment of the outer winding formed in the metal-1 layer (and the top winding segment thereof formed in the metal-4 layer), and thus the reference to the metal-1 runner, the teachings of the present invention can be applied to form the bottom winding segment in a metal layer above metal layer 1. For example, the bottom winding segment of the outer winding can be formed from a metal-2 runner and the top winding segment can be formed from a metal-5 runner. Similarly, the inner winding top and bottom metal segments can be formed in various layers, so long as they are formed between the top and bottom winding segments of the outer winding.

Figure 4:
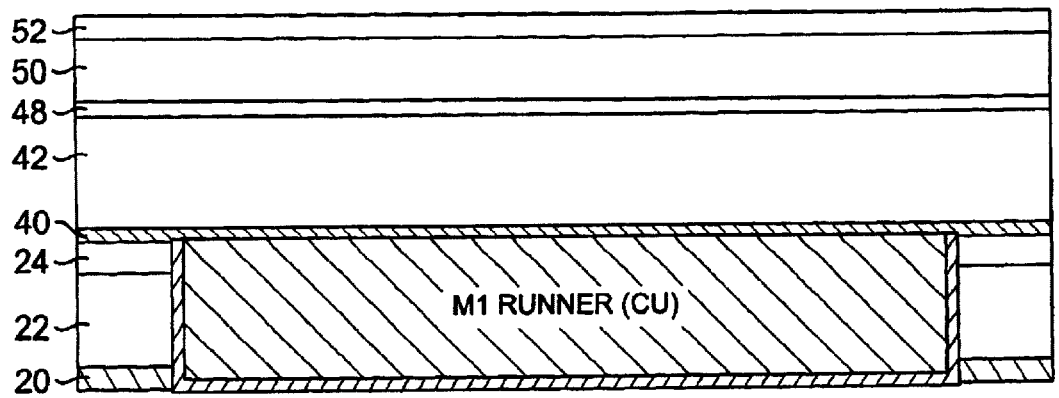

As shown in FIG. 4, a second four-layer stack is now formed over the metal-1 runner 34 and the adjacent regions of the layers 20, 22 and 24. The bottom layer in the four-layer stack comprises a barrier layer 40 (preferably of titanium-nitride) as shown. An insulating layer 42 preferably having a relatively low dielectric constant is formed over the barrier layer 40 and comprises low dielectric constant silicon-dioxide, black diamond or coral. The use of a low dielectric constant material is advantageous to reduce inter-layer capacitance and thus inter-layer cross-talk, but it is not required that the insulating layer 42 comprise a low-dielectric material. An etch stop layer 48, formed of, for example, silicon-nitride, is formed over the insulating layer 42. Another insulating layer 50, preferably having a low dielectric constant, is formed over the etch stop layer 48. A hard mask layer 52 is formed over the insulating layer 50. As discussed above, conventional photoresist, masking and patterning processes can be used in lieu of the hard-mask layer 52.

Figure 5:
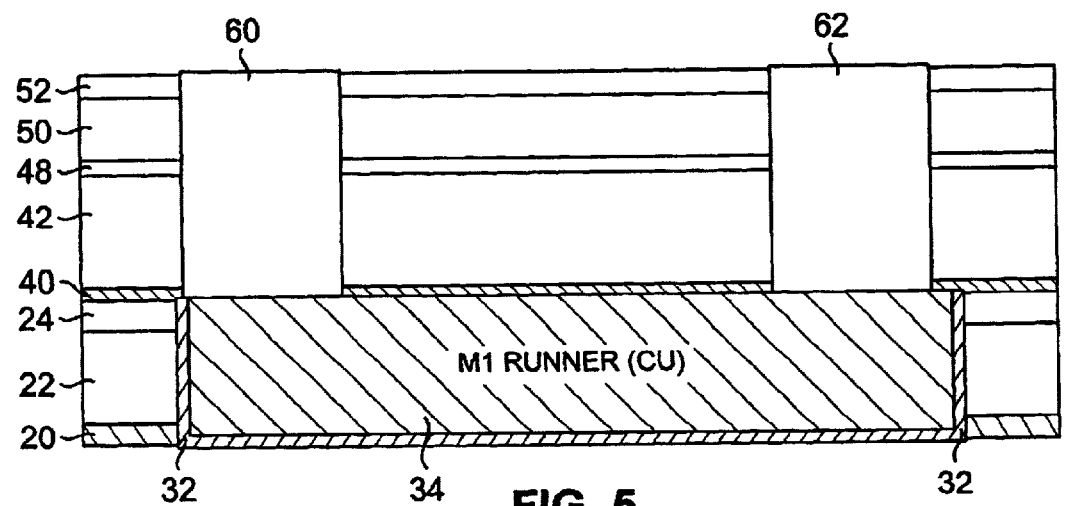

Turning to FIG. 5, a masking step employing the hard mask layer 52 defines the areas where second-level via openings 60 and 62 are to be formed. Using the defined pattern, the second-level via openings 60 and 62 are then etched downwardly to the barrier layer 40. An additional etch step is then employed to remove the barrier layer 40 from the base of the via openings 60 and 62. At this point in the fabrication process there may be other areas of the integrated circuit that also require via openings at this level and therefore these can be formed simultaneously with the via openings 60 and 62. In general, this is the case when any of the layers associated with the transformer are formed; via openings and trenches required in other regions of the integrated circuit can be simultaneously formed. Thus the method of the present invention does not add any additional masking steps to the integrated circuit formation process. It is only necessary to define additional regions for the transformer structures within the masks used to form vias and interconnects throughout the integrated circuit.

Figure 6:
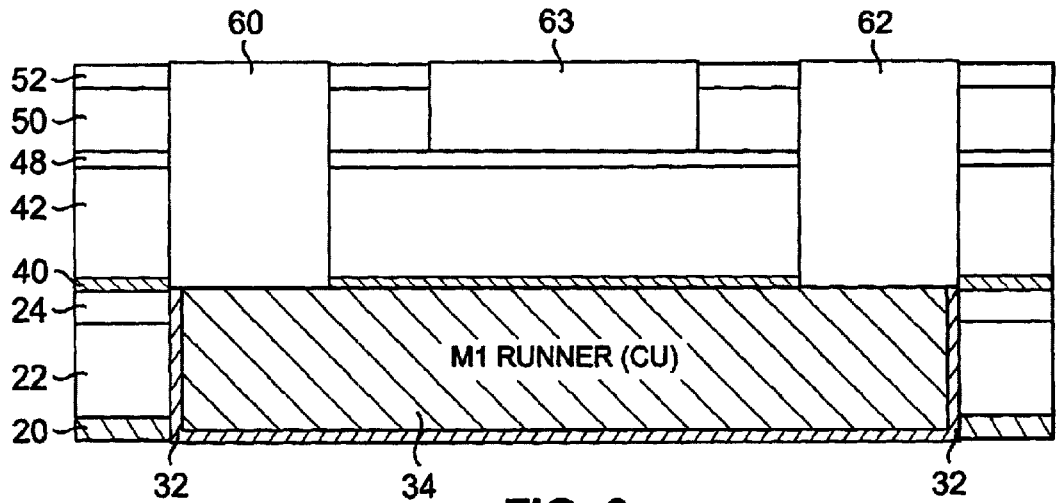

As further illustrated in FIG. 6, a trench 63 is formed, extending downwardly to the etch stop layer 48. In a preferred embodiment, to effectively stop the etch process at the etch stop layer 48, the etching process is monitored to analyze the byproducts that are etched from the material. In this case, when the material of the etch stop 48 is detected, the etch process is terminated. As a result, the trench 63 extends downwardly through the mask layer 52 and the insulating layer 50, terminating within the etch stop layer 48. As can be seen for the finished structure of FIG. 12, preferably the trench 63 is offset from the vertical plane of the metal-1 runner 34, such that the vertical plane of the trench 63 is behind the vertical plane of the metal-1 runner 34.

Figure 7:
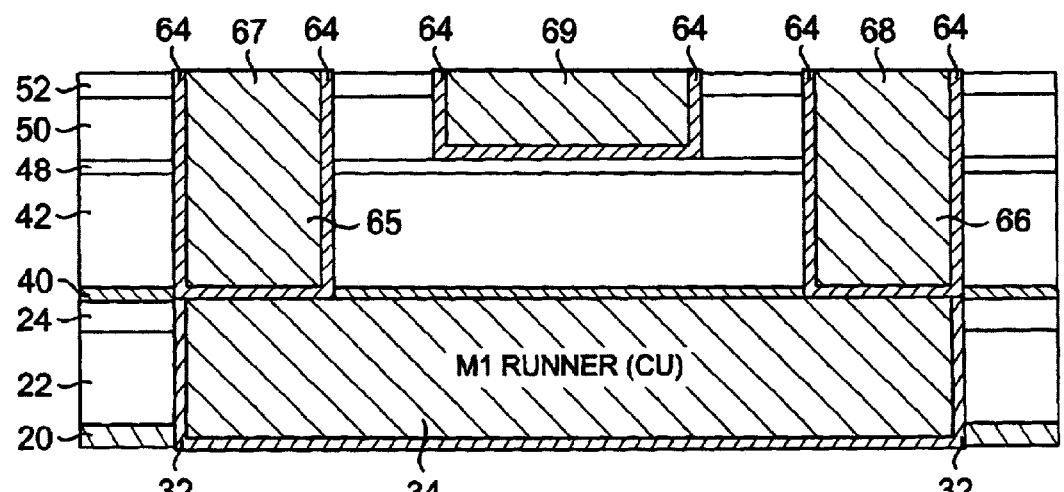

A barrier and seed layer 64 is deposited within the via openings 60 and 62 and the trench 63. The process and materials are identical to those discussed in conjunction with the barrier and seed layer 32 of FIG. 3. As illustrated in FIG. 7, copper is then preferably electroplated within the via openings 60 and 62 and the trench 63, followed by a chemical and mechanical polishing step to planarize the top surface. At this point, the two copper regions in the lower portion of the via openings 60 and 62 are referred to as conductive vias 65 and 66. The copper material in the upper regions (i.e., in the same horizontal plane as the trench 63) of the via openings 60 and 62 is referred to as metal-2 via layers 67 and 68, respectively. The copper material in the trench 63 is referred to as a metal-2 runner 69.

Figure 8:
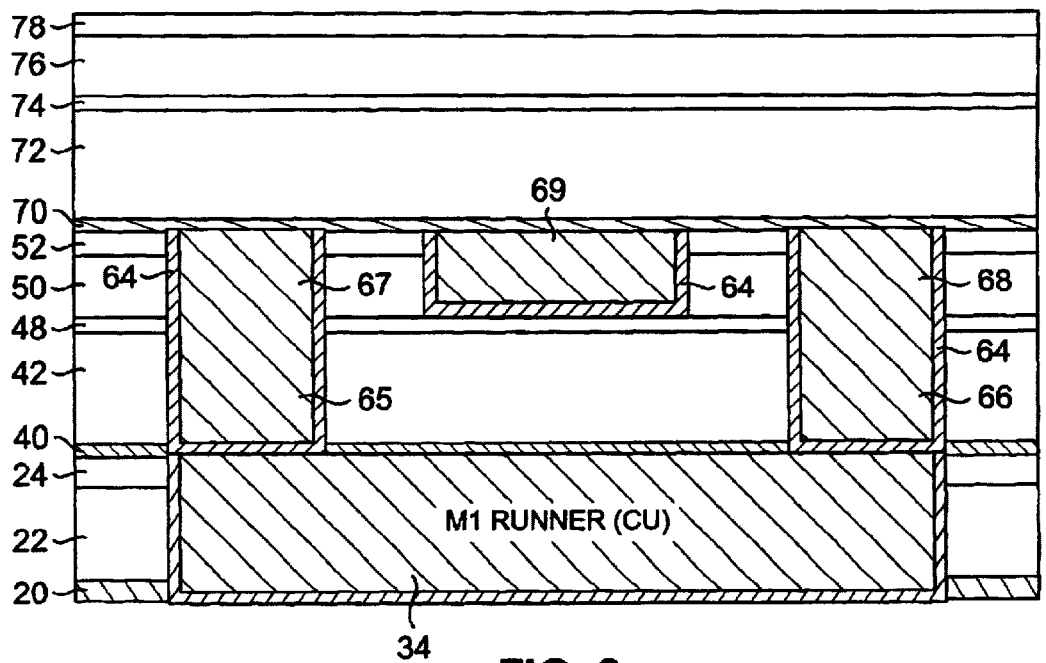

As shown in FIG. 8, a multi-layer stack is formed over the existing layers, where the material of the individual layers is preferably identical to the materials used in the multi-layer stack discussed in conjunction with FIG. 4. In particular, the layers formed sequentially include a barrier layer 70, an insulating layer 72 (preferably comprising material having a low dielectric constant), an etch stop layer 74, an insulating layer 76 (again preferably comprising a low dielectric constant material), and a hard mask layer 78.

Figure 9:
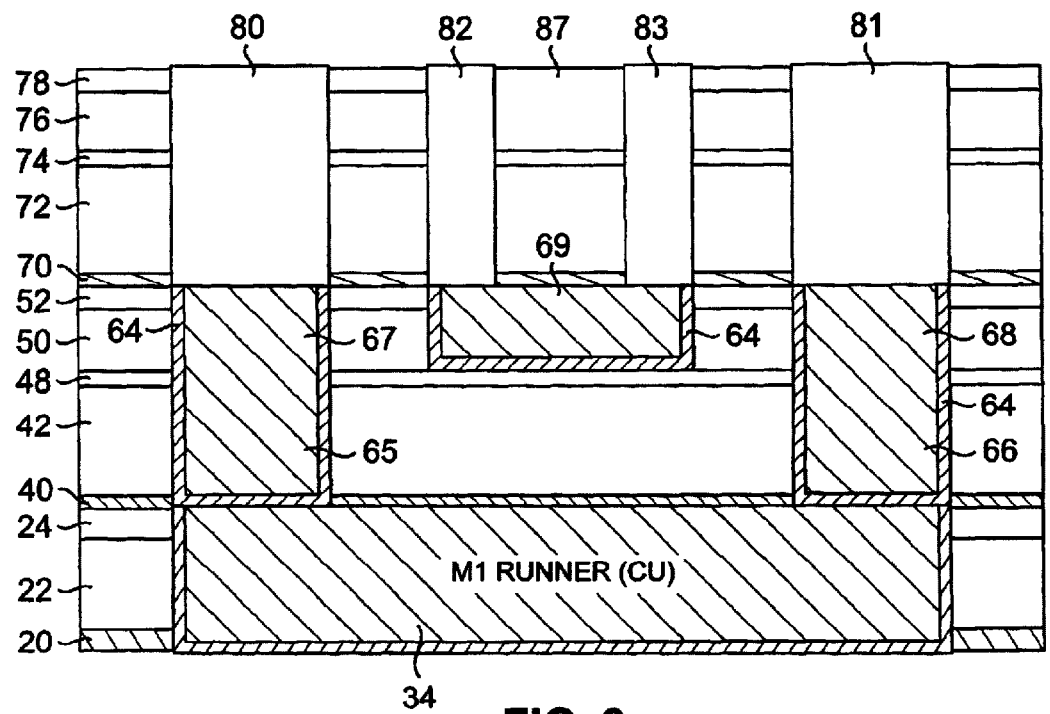

As shown in FIG. 9, the hard mask layer 78 is patterned and etched to form four via openings. Two via openings 80 and 81 extend downwardly from the hard mask layer 78 to the top surface of the barrier layer 70 in substantial vertical alignment with the metal-2 via layers 67 and 68, respectively. Two additional via openings 82 and 83 extend downwardly from the hard mask layer 78 to the top surface of the barrier layer 70 in vertical alignment with end regions 84 and 85 of the metal-2 runner 69. Recall that the metal-2 runner is in a plane behind the metal-1 runner 34, thus the via openings 82 and 83 are in a vertical plane behind the via openings 80 and 81. In one embodiment the via openings 80, 81, 82 and 83 have the same size in the horizontal dimension of FIG. 9. The exposed barrier layer 70 at the bottom of the via openings 80, 81, 82 and 83 is then removed by an additional etch step. The hard mask layer 78 is again patterned and etched to form a trench 87 extending vertically from the hard mask layer 78 to the top surface of the etch stop layer 74. As can be seen from the top view of FIG. 12, the trench 87 is in a vertical plane that intersects the vertical plane of the metal-2 runner 69. Thus, the trench 87 extends rearward from the vertical plane of the metal-2 runner 69 for interconnecting two successive parallel metal-2 runners 69.

Barrier layers 90 are then applied to the interior surfaces of the four via openings 80, 81, 82 and 83 and the trench 87. Metal is then deposited or electroplated within the via openings 80, 81, 82 and 83 and the trench 87. Thus conductive vias 92 and 94 are formed within the via openings 80 and 81, respectively. The two conductive regions in the lower portion of the via openings 82 and 83 are referred to as conductive vias 96 and 98, respectively. The conductive material in the upper regions of the via openings 82 and 83 is referred to as metal-3 via layers 100 and 102, respectively. The conductive material in the trench 87 is referred to as a metal-3 runner 104. The resulting structure is illustrated in FIG. 10, but again note that the metal-3 runner 104 interconnects two successive metal-2 runners 69, which is not necessarily apparent from FIG. 10. According to the top view of FIG. 12, the end of the metal-3 runner 104 in electrical contact with the conductive via 98 and the metal-2 runner 69 in a first vertical plane, and the other end of the metal-3 runner 104 is in electrical contact with the conductive via 96 of the next rearward metal-2 runner 69, which is in a second vertical plane behind the first vertical plane.

Figure 10:
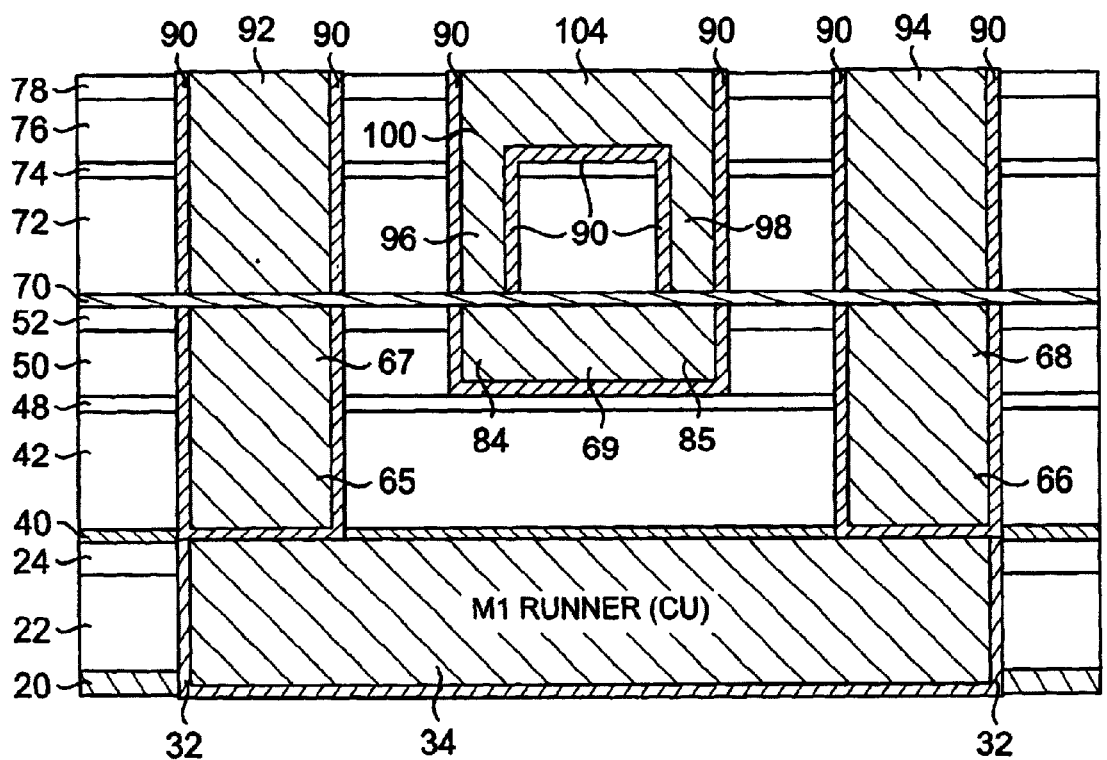
Figure 11:
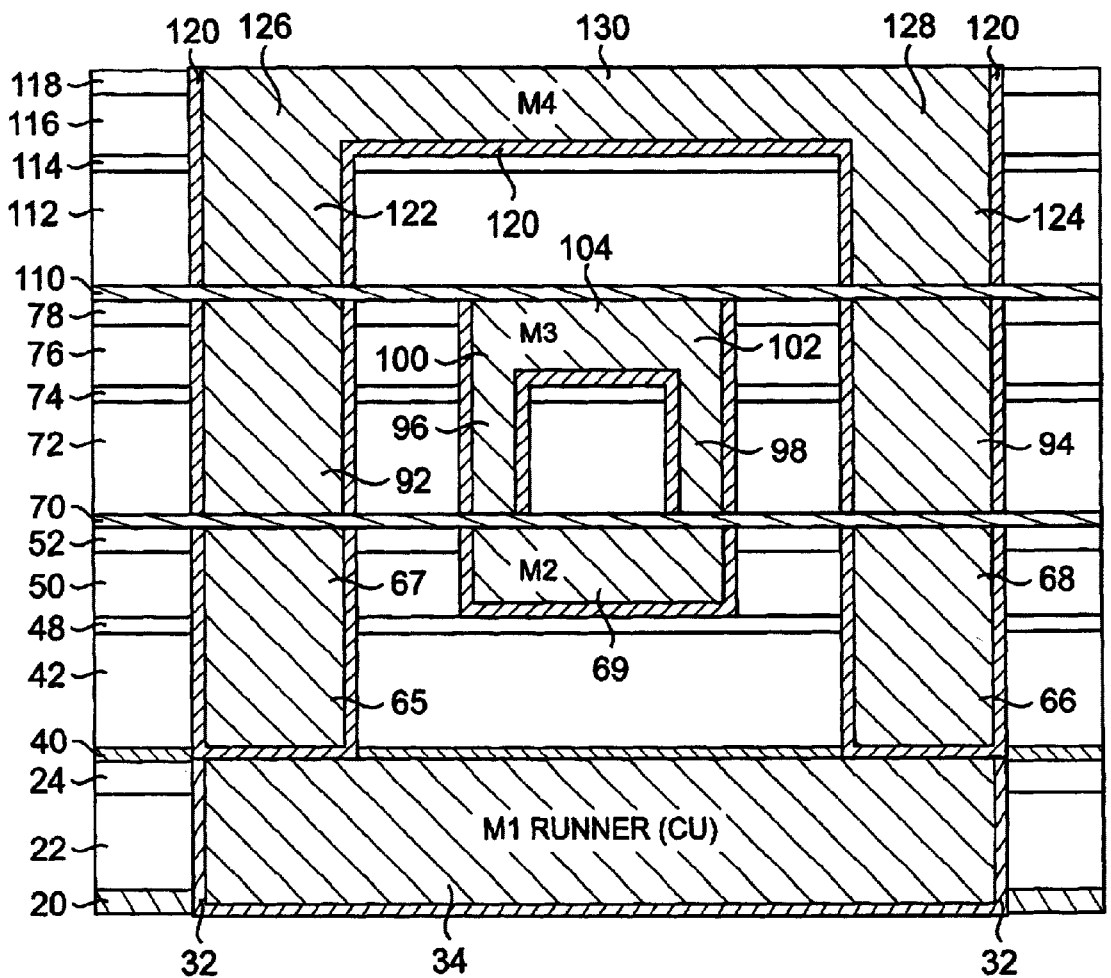

To complete formation of the transformer of the present invention, another stack of insulating layers is disposed on the top surface of the FIG. 10 structure. As shown in FIG. 11, this stack of insulating layers comprises: a barrier layer 110, a dielectric layer 112 (preferably formed of a material having a relatively low dielectric constant) an etch stop layer 114 (preferably formed of silicon nitride) a dielectric layer 116 (preferably formed of a material having a relatively low dielectric constant) and a hard mask layer 118. A patterning and etching process, using a pattern masked into the hard mask layer 118, forms a pair of via openings extending downwardly from the hard mask 118 to the top surface of the barrier layer 110 and in substantially vertical alignment with the conductive vias 92 and 94. The exposed portions of the barrier layer 110 at the bottom of the pair of via openings is then removed. A second masking and etching step forms a trench extending between the pair of via openings and having a bottom surface adjacent the top surface of the etch stop layer 114. A barrier layer 120, shown in FIG. 11, is deposited on the interior surfaces of the pair of vias and the trench. Metal, preferably copper, is deposited to form conductive vias 122 and 124 and metal-4 via layers 126 and 128 aligned vertically therewith, respectively. An interconnecting metal-4 runner 130 is also formed, to interconnect two successive metal-1 runners via the two stacks of conductive vias shown in FIG. 11. Thus one end of the metal-4 runner 130 is in the same vertical plane as the conductive via 124 and the metal-4 via layer 128 connected to the metal-1 runner 34, and the other end of the metal-4 runner is connected to the metal-4 via layer 126 and the conductive via 122 connected to the next metal-1 runner 34 in the plurality of parallel metal-1 runners 34.

Figure 12:
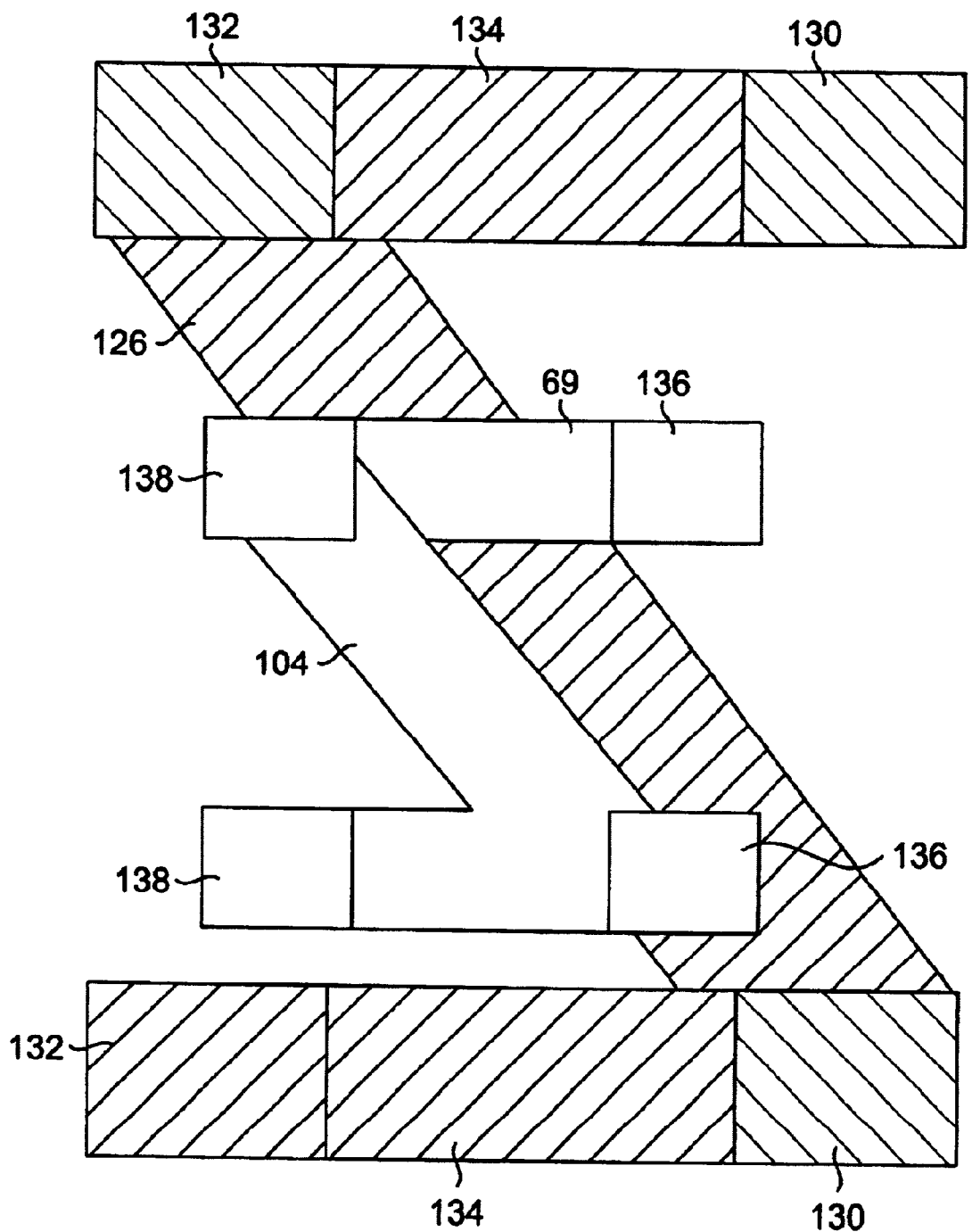
FIGS. 12, 13 and 14 illustrate top views of transformer structures according to several embodiments of the present invention.

According to FIG. 11, the transformer appears as two concentric closed polygons (rectangles in FIG. 11) forming the outer and inner windings. A top view of the transformer constructed according to the teachings of the present invention, is illustrated in FIG. 12 and reveals the third dimension orientation of the various transformer components. Two successive parallel metal-1 runners 34 are interconnected by a diagonal metal-4 runner 126, via vertical conductive structures 130 and 132. The vertical conductive structure 132 comprises the conductive via 65, the metal-2 via layer 67, the conductive via 92, the conductive via 122 and the metal-4 via layer 126. The vertical conductive structure 130 comprises the conductive via 66, the metal-2 via layer 68, the conductive via 94, the conductive via 124 and the metal-4 via layer 128. Similarly, two successive parallel metal-2 runners 69 are interconnected by a diagonal metal-3 runner 104 via vertical conductive structures 136 and 138. The vertical conductive structure 138 comprises the conductive via 96 and the metal-3 via layer 100. The vertical conductive structure 136 comprises the conductive via 98 and the metal-3 via layer 102.

Figure 13:
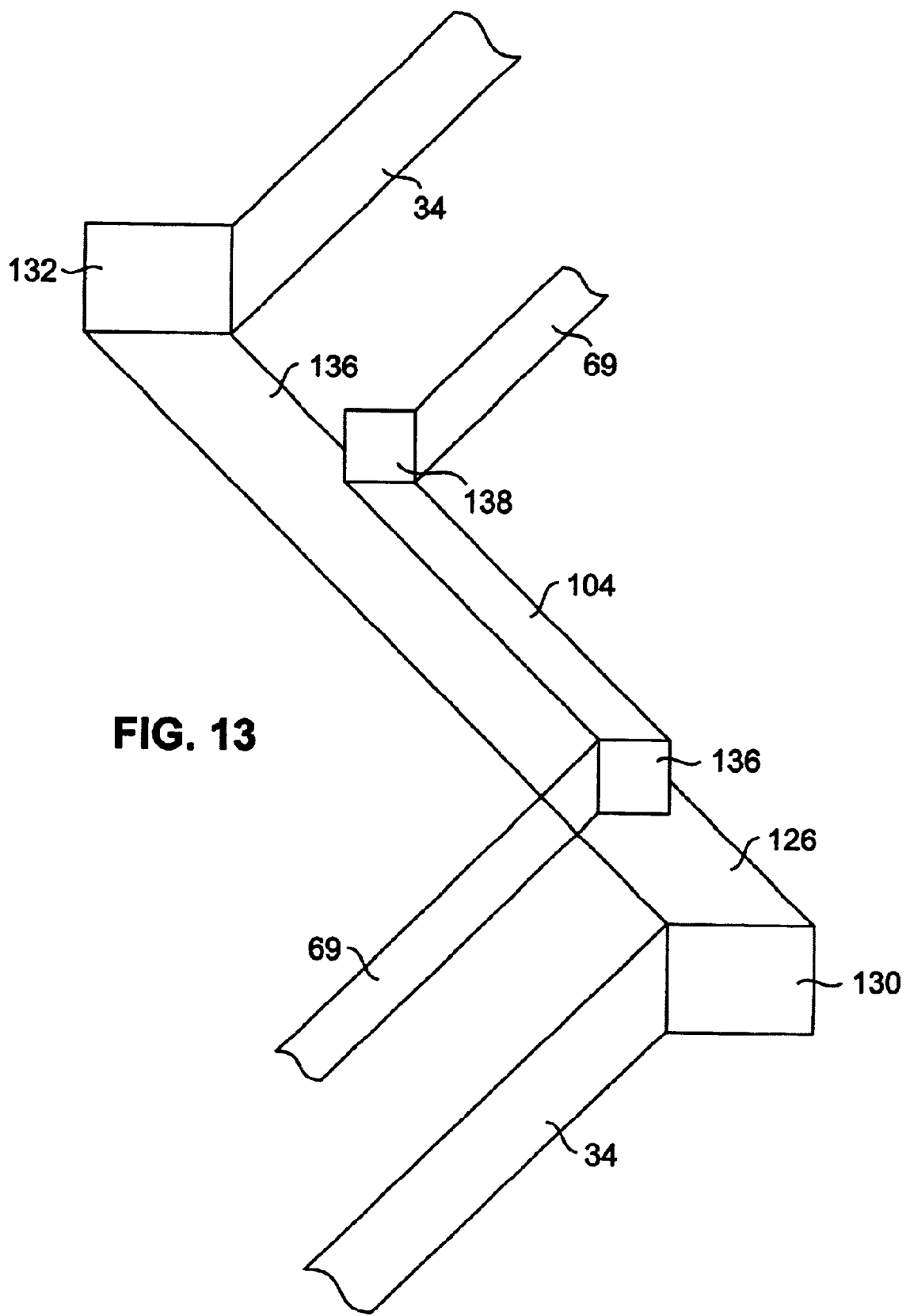
Figure 14:
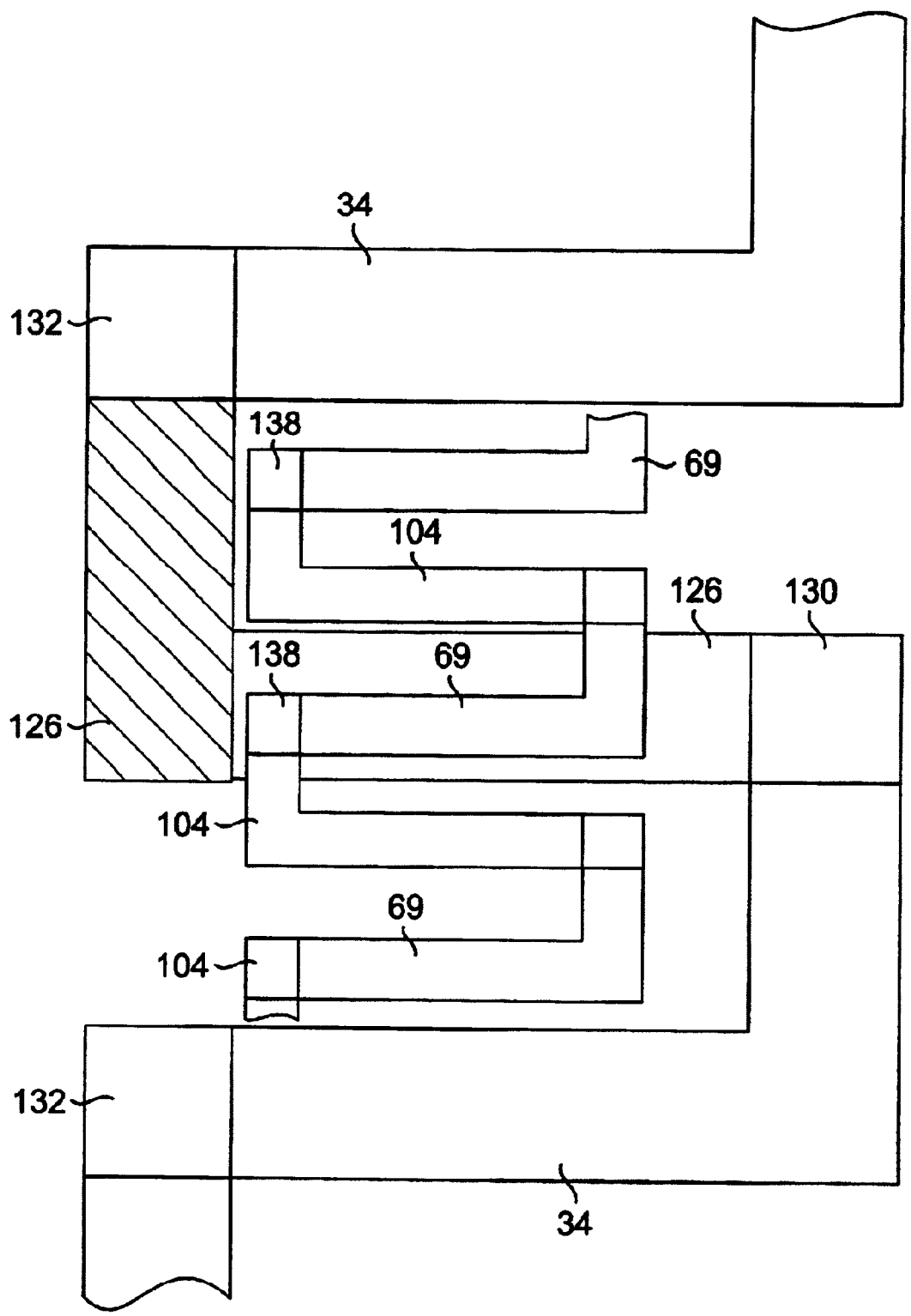

The plurality of metal-1 runners 34 and the plurality of metal-4 runners 126 can take on various other orientations and interconnection configurations. For instance, the angle between each metal-1 runner 34 and the metal-4 runner 126 can be made greater than or equal to 90° to produce a zig-zag pattern in the top view. See FIG. 13. Alternatively, both the metal-1 runners 34 and the metal-4 runners 126 can be L-shaped and interconnected such that the short leg on one runner connects to the long leg of the next runner. See FIG. 14. Typically, the transformer secondary windings, comprising the metal-2 runner 69 and the metal-3 runner 104, have the same shape and orientation as the primary windings. See FIGS. 12, 13 and 14.

The turns ratio between the outer and inner windings (either of which can operate as the primary winding while the other operates as the secondary winding) of the transformer can be modified by changing the distance between successive metal-2 runners 69 relative to the distance between successive metal 1-runners 34, so that greater or fewer number of coils or turns comprising the metal-2 and metal-3 runners 69 and 104 are positioned between successive metal-1 runners 34.

Although the Figures and description herein illustrate placement of the bottom and top metal layers of the outer winding in the metal-1 and metal-4 layers of the integrated circuit, the inventive features of the present invention can be applied such that the transformer structure spans other metal layers, for example, the bottom segment of the outer windings can be placed within the metal-2 layer and the top segment within the metal-5 layer. The inner windings similarly span any number of metal layers between the metal layers spanned by the outer winding. Other embodiments where different metal layers are spanned are considered within the scope of the present invention.

Advantageously, the multi-layer transformer formed according to the teachings of the present invention is compatible with conventional CMOS backflow (i.e., interconnect) processing and does not require any additional masking steps during the process of fabricating the CMOS devices. Because the conductive structures are formed of copper, the resulting conductor has relatively lower resistance than those formed with aluminum and thus a higher Q. The inner winding is completely enclosed within the outer winding, resulting in a relatively high coupling factor. As illustrated by the processing steps discussed above, the transformer is highly integratable either on-chip with other active elements or as part of a multi-module device constructed on a common substrate. Although the two windings are conventionally designed for simultaneous use to provide transformer action, they can be used independently as inductors.

Although formation of the outer and inner windings of the transformer according to the present invention has been described using a damascene process, the invention is not limited thereto. The transformer windings can also be formed using conventional metal deposition and etch steps wherein the metal layers forming the top and bottom winding segments are interconnected by vertical vias spanning at least three metal layers, i.e., at least one metal layer is not used to form either a top or a bottom winding segment.

An architecture and process have been described as useful for forming a thin film multi-layer high Q transformers on a semiconductor substrate. While specific applications of the invention have been illustrated, the principals disclosed herein provide a basis for practicing the invention in a variety of ways and in a variety of circuit structures. Numerous variations are possible within the scope of the invention, including the use of any two metal layers to form the transformer windings. The invention is limited only by the claims that follow.

What is claimed is:

1. An integrated circuit structure comprising:
   a semiconductor substrate having a plurality of insulating layers and a plurality of conductive layers therebetween;
   an outer coil; and
   an inner coil disposed within the interior of said outer coil;
   said outer coil further comprising:
      a plurality of parallel first conductive strips overlying said semiconductor substrate and formed within a lower conductive layer of the semiconductor substrate;
      a first stack of one or more conductive vias in electrical connection with a first end of each one of the plurality of first conductive strips;
      a second stack of one or more conductive vias in electrical connection with a second end of each one of the plurality of first conductive strips; and
      a plurality of parallel second conductive strips having a first end in electrical connection with the uppermost via of the first stack of one or more conductive vias, and a second end in electrical connection with the uppermost via of the second stack of one or more conductive vias, such that a second conductive strip is disposed between and interconnects two successive first conductive strips, wherein the plurality of second conductive strips are vertically spaced-apart from the plurality of first conductive strips with at least three intervening conductive layers therebetween;
   said inner coil further comprising:
      a plurality of parallel third conductive strips overlying said semiconductor substrate;
      a third stack of one or more conductive vias in electrical connection with a first end of each one of the plurality of third conductive strips;
      a fourth stack of one or more conductive vias in electrical connection with a second end of each one of the plurality of third conductive strips; and
      a plurality of parallel fourth conductive strips having a first end in electrical connection with the uppermost via of the third stack of one or more conductive vias, and a second end in electrical connection with the uppermost via of the fourth stack of one or more conductive vias, such that a fourth conductive strip is disposed between and interconnects two successive third conductive strips , wherein the plurality of second conductive strips are vertically spaced-apart from the plurality of first conductive strips with at least three intervening conductive layers therebetween.

2. A multi-level integrated circuit structure, comprising:
   a semiconductor substrate having a plurality of insulating layers and a plurality of conductive layers therebetween, and further having a plurality of active devices therein;
   an outer winding; and
   an inner winding at least partially disposed within the interior of said outer winding;
   said outer winding further comprising:
      runner conductive portions including first and second terminal ends of the outer winding;
      vertical conductive via portions;
      wherein a plurality of first lower runner portions are formed in a lower conductive layer of the semiconductor substrate;
      wherein first upper runner portions are formed with at least three intervening conductive layer between the plurality of first lower runner portions and the first upper runner portions;
      wherein two or more vertically aligned first via portions effect electrical connection between a first end of a first one of the plurality of first lower runner portions and an overlying first end of a first upper runner portion;
      wherein two or more vertically aligned second via portions effect electrical connection between a first end of a second one of the plurality of first lower runner portions and an overlying second end of the first upper runner portion;

wherein each of the first and the second terminal ends of the outer winding is connected to one of the plurality of active devices;

said inner winding further comprising:

runner conductive portions including first and second terminal ends of the inner winding;

vertical conductive via portions;

wherein a plurality of second lower runner portions are formed in a lower conductive layer of the semiconductor substrate;

wherein second upper runner portions are formed with at least one intervening conductive layer between the plurality of second lower runner portions and the second upper runner portions;

wherein two or more vertically aligned third via portions effect electrical connection between a first end of a first one of the plurality of second lower runner portions and an overlying first end of a second t upper runner portion;

wherein two or more vertically aligned fourth via portions effect electrical connection between a first end of a second one of the plurality of second lower runner portions and an overlying second end of the second upper runner portion wherein each of the first and second terminal ends of the inner winding is connected to one of the plurality of active devices.

* * * * *